US012672251B2

(12) United States Patent
Mayer et al.

(10) Patent No.: US 12,672,251 B2
(45) Date of Patent: Jun. 30, 2026

(54) DEVICE WITH CONNECTION ARRANGEMENT

(71) Applicant: SEW-EURODRIVE GMBH & CO. KG, Bruchsal (DE)

(72) Inventors: Ralph Mayer, Ubstadt-Weiher (DE); Ralf Bennerscheidt, Karlsruhe (DE); Rodion Zerr, Bruchsal (DE); Christian Hofmann, Östringen (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 328 days.

(21) Appl. No.: 18/577,599

(22) PCT Filed: Jun. 13, 2022

(86) PCT No.: PCT/EP2022/066049
§ 371 (c)(1),
(2) Date: Jan. 8, 2024

(87) PCT Pub. No.: WO2023/280526
PCT Pub. Date: Jan. 12, 2023

(65) Prior Publication Data
US 2024/0251520 A1      Jul. 25, 2024

(30) Foreign Application Priority Data
Jul. 7, 2021      (DE) ......................... 102021003501.1

(51) Int. Cl.
H05K 7/14          (2006.01)
(52) U.S. Cl.
CPC .............................. H05K 7/14327 (2022.08)

(58) Field of Classification Search
CPC ................................................. H05K 7/14327
(Continued)

(56) References Cited

U.S. PATENT DOCUMENTS 5,982,253 A       11/1999  Perrin et al.
10,763,690 B2 *    9/2020  Pfeilschifter ........... B60L 53/24
(Continued)

FOREIGN PATENT DOCUMENTS

EP          0735646 B1      6/1999
EP          1466402 B1      4/2007
EP          2037228 A1      3/2009

OTHER PUBLICATIONS

International Report on Patentability issued in corresponding International Application No. PCT/EP2022/066049 dated Dec. 14, 2023, pp. 1-10, English Translation.
(Continued)

*Primary Examiner* — Gary F Paumen
(74) *Attorney, Agent, or Firm* — Carter, DeLuca & Farrell LLP

(57) ABSTRACT

In a device with connection arrangement, the connection arrangement includes a connection unit and an EMC unit. The EMC unit includes a first electrical plug connector which is connected, e.g., plug-connected, to a mating plug connector, e.g., corresponding to the electrical plug connector, of the connection unit. The EMC unit includes a connection for supply lines, e.g., a mains connection, an AC supply mains connection, etc. For example, the supply lines are adapted to supply the device with electrical power.

30 Claims, 4 Drawing Sheets

(58) Field of Classification Search
USPC ......................................................... 439/76.1
See application file for complete search history.

(56)                    References Cited

U.S. PATENT DOCUMENTS

| | | | |
|---|---|---|---|
| 10,953,751 B2 * | 3/2021 | Pfeilschifter | ........... B60L 50/40 |
| 2019/0168628 A1 * | 6/2019 | Pfeilschifter | ........... B60L 53/24 |
| 2020/0099283 A1 * | 3/2020 | Bian | ...................... H02K 29/08 |

OTHER PUBLICATIONS

International Search Report issued in corresponding International Application No. PCT/EP2022/066049 dated Oct. 10, 2022, pp. 1-2, English Translation.

* cited by examiner

DEVICE WITH CONNECTION ARRANGEMENT

FIELD OF THE INVENTION

The present invention relates to a device with a connection arrangement.

BACKGROUND INFORMATION

In certain conventional systems, an electrical appliance has electrical connections for supply lines.

An EMC suppression device for a DC motor is described in U.S. Pat. No. 6,104,110.

A compact liquid-cooled power converter with multiple printed circuit boards is described in European Patent Document No. 1 466 402.

A structure of a terminal connection in an electric motor with a speed reduction mechanism is described in European Patent Document No. 0 735 646.

SUMMARY

Example embodiments of the present invention suppress interference in a device and/or make it electromagnetically compatible.

According to example embodiments of the present invention, in a device with a connection arrangement, the connection arrangement has a connection unit and an EMC unit. The EMC unit includes a first electrical plug connector which is connected, e.g., plug-connected, to a mating plug connector, e.g., corresponding to the electrical plug connector, of the connection unit, and the EMC unit includes a connection for supply lines, e.g., a mains connection, an AC supply mains connection, etc. For example, the supply lines are adapted to supply the device with electrical power.

Thus, the EMC measures can be arranged as close as possible to the mains connection. For example, the measures are arranged within the device. The plug connection allows the required interference suppression and/or measure to be optimally adapted, since the EMC unit can be exchanged for another EMC unit with the same plug connector, in which the other EMC unit has optimized measures adapted to the changing requirements. This means that a series of devices can also be formed in which the EMC unit can be formed differently for different variants of the series.

For example, the measure is directly connected to the mains connection. The measure thus has a direct effect, e.g., by avoiding long cable lengths arranged between the measures and the electronics of the device.

According to example embodiments, the EMC unit has components for improving electromagnetic compatibility and/or for interference suppression. For example, a circuit board is fitted with the components and the first plug connector. Thus, the EMC measures are mechanically connected as a unit. The EMC unit is thus a module which can be connected to the connection unit, which is also a module. This is because the connection unit is also connected to the electronics, e.g., the converter electronics, of the device via plug connectors, and a plug connector part for power and a plug connector part for data are fitted on a printed circuit board of the connection unit.

According to example embodiments, the EMC unit has a mains choke and/or Y capacitors. For example, the or a circuit board is equipped with the mains choke and/or the Y capacitors and the first plug connector. Thus, cost-effective EMC measures can be provided prefabricated on a circuit board and can thus be stored and transported as a whole.

According to example embodiments, the EMC unit has a housing formed from a lower part and an upper part. Thus, the housing provides protection and, for example, causes electrical insulation. This increases safety. However, the housing is arranged inside the housing of the device and thus does not need to be waterproof or have a high degree of protection, whereas the housing of the device can be configured with a high degree of protection, e.g., to be waterproof. If the device is an electric motor in whose connection box the EMC unit is arranged, the connection box surrounds the housing in a housing-forming manner and with a high type of protection.

According to example embodiments, the housing encloses the components and/or the mains choke, the Y capacitors, and the first plug connector in a housing-forming manner. Thus, cost-effective EMC measures are provided.

According to example embodiments, the assembled circuit board is enclosed by the housing in a housing-forming manner. Thus, the housing of the EMC unit is arranged inside the housing of the device and thus only the latter needs to be provided with a high type of protection.

According to example embodiments, the lower part is clip-connected to the upper part. Thus, ready production is possible.

According to example embodiments, one region of the upper part is formed as a partial region of a hollow cylinder, and the partial region includes an end face of the hollow cylinder and a jacket section of the hollow cylinder. Thus, the partial region follows the contour of the mains choke, which itself has a cylindrical shape. The partial region thus at least partially envelops the mains choke. For example, the distance between the partial region is constant or always smaller than a maximum distance value.

According to example embodiments, the partial region has first slots passing through the upper part. The first slots each extend radially relative to the cylinder axis of the hollow cylinder and are spaced from one another, e.g., spaced evenly, in the circumferential direction. For example, each of the first slots covers the same radial distance range in the radial direction, e.g., relative to the cylinder axis, and/or the first slots are formed geometrically identical to one another. Thus, convective cooling is possible, since air flows are driven convectively in the intermediate space region between the mains choke and partial region when the mains choke is heated. The first slots allow throughflow from the intermediate space region to the outer environment and vice versa.

According to example embodiments, the partial region has further slots passing through the upper part. The further slots, relative to the cylinder axis of the hollow cylinder, each extend both partially over the jacket section and partially in the end face, e.g., coming from radially outside. Thus, an improved throughflow is made possible since an air flow can flow in at the further slot in the region of the jacket surface and flow out to a first slot, i.e., at the end face.

According to example embodiments, the further slots are spaced apart from the first slots, e.g., spaced apart in the circumferential direction. Thus, an improved throughflow can be achieved and the stability and rigidity of the upper part remains guaranteed.

According to example embodiments, the radial distance range covered by the first slots, e.g., in the radial direction, overlaps with the radial distance range covered by the further slots, e.g., in the radial direction. For example, the radial distances are relative to the cylinder axis of the hollow cylinder. Thus, the end face can be better ventilated, which improves cooling.

According to example embodiments, the partial region at least partially encloses the mains choke, which is, for example, configured to be substantially cylindrical. For example, the shortest distance between each point of the partial region and the mains choke is less than a maximum distance value, e.g., the maximum distance value is one centimeter. Thus, the partial region follows the surface of the mains choke, which provides for space-saving insulation.

According to example embodiments, the connection unit has a printed circuit board enclosed by a cover, which printed circuit board is fitted with the mating plug connector. For example, the printed circuit board is additionally fitted with a second plug connector, e.g., for low-voltage lines, as well as with a third plug connector, e.g., for extra-low voltage lines, and with a grounding plate and/or with a connection for extra-low voltage lines and with a connection for data lines. Thus, the transmission and/or distribution of electrical lines or potentials is made possible. For example, different functions can be assigned to the printed circuit board by fitting it with different electrical components.

According to example embodiments, the cover includes at least two parts, e.g., consists of two parts. The two parts of the cover are clip-connected to one another, and, when clipping in the two parts, the connecting direction is parallel to the actuating direction of the first plug connector. For example, the cover, the upper part, and the lower part are made of plastic, e.g., for electrical insulation of the printed circuit board or, respectively, the EMC components. Thus, the cover is first closed around the printed circuit board by the clip connection of the two parts, and the EMC unit can be plugged in in the same direction, in which, for example, the upper part and the lower part of the EMC unit are already connected to each other beforehand. In this manner, a quick and ready connection can be achieved despite the proximity to the connection unit.

According to example embodiments, the printed circuit board is fitted with a or the grounding plate. For example, the grounding plate is connected to a metal housing part of the device by screws. Thus, grounding is achieved using two or more screws. This provides for a secure connection between the housing part and the grounding plate. The grounding plate is, for example, L-shaped and its long leg of the L is placed on the printed circuit board and solder-bonded.

According to example embodiments, the device is an electric motor with a connection box, and the connection arrangement is arranged in the connection box. For example, the connection box has a cover in which a converter is arranged in an integrated manner. Thus, a converter can be arranged in an integrated manner in the connection box together with the EMC measures, which are thus arranged shielded in the metal connection box of the electric motor in a protected manner. It is also possible that the EMC measures can be connected directly to the connection unit via the first plug connector and can be arranged in the lower part of the connection box, in which the electronics of the converter are arranged in the cover of the connection box.

According to example embodiments, the device is a converter, within the housing of which the connection arrangement is arranged. Thus, ready production is possible. In addition, due to the modular configuration, the EMC unit can be exchanged for another EMC unit, or one of the EMC units available in a modular system can be selected when producing a converter, so that the appropriate EMC measure can be installed.

Further features and aspects of example embodiments of the present invention are explained in more detail below with reference to the appended schematic Figures.

DETAILED DESCRIPTION

Figure 1:
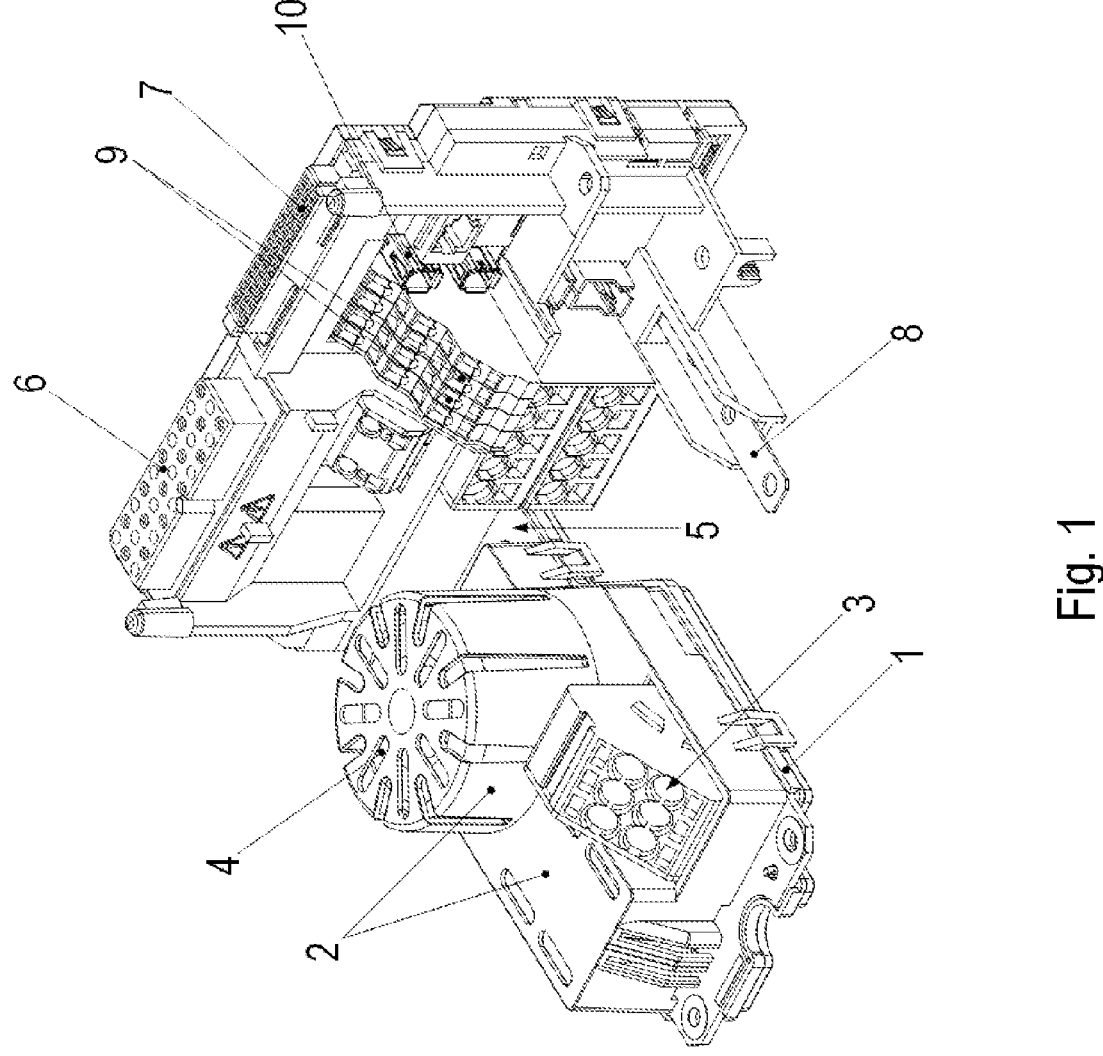
FIG. 1 is a perspective view of an electrical connection arrangement of a device, which electrical connection arrangement has a pluggable EMC unit.
Figure 2:
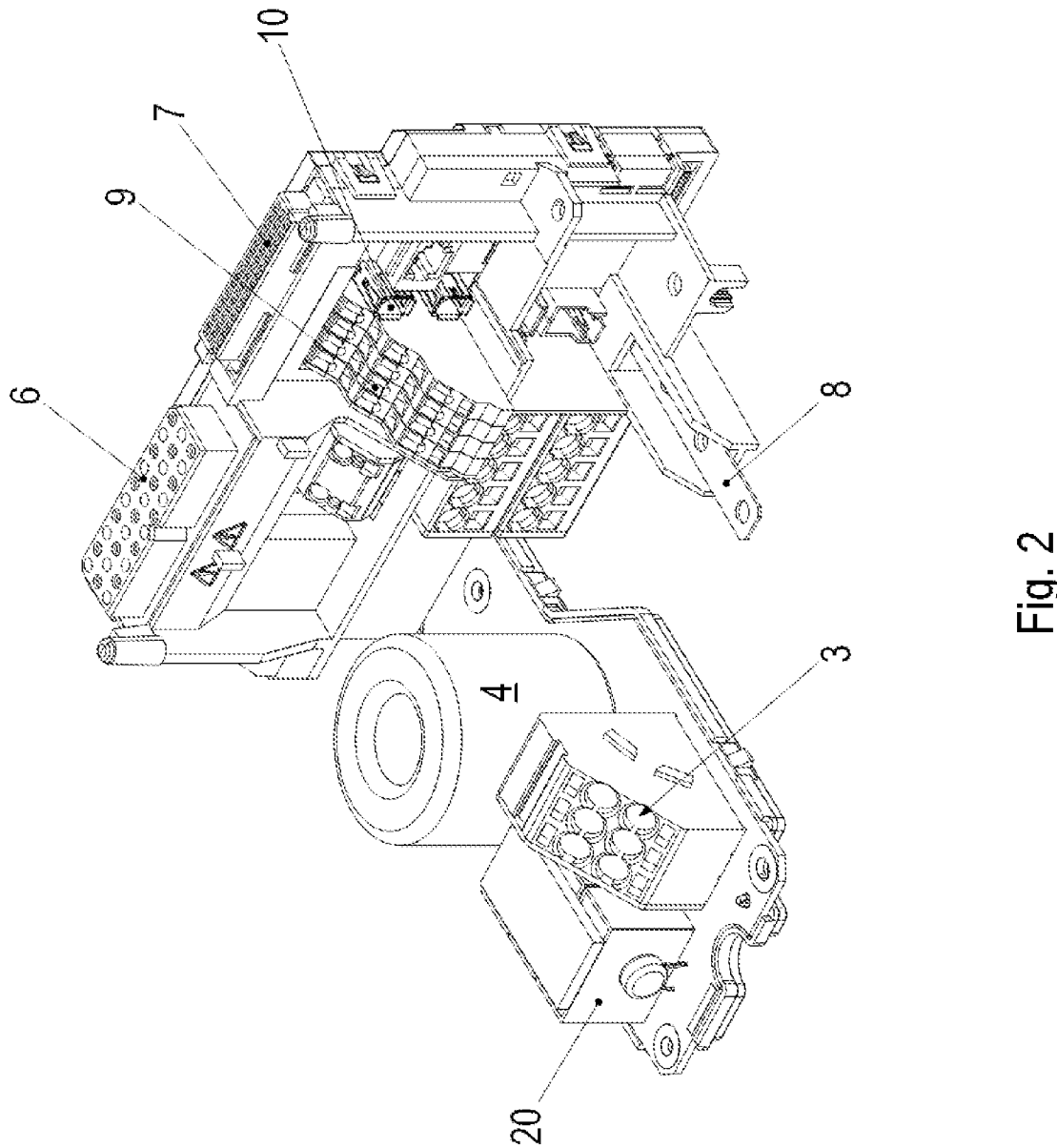
As illustrated in FIG. 2, in contrast to FIG. 1, an upper part 2 of the pluggable EMC unit is removed.
Figure 3:
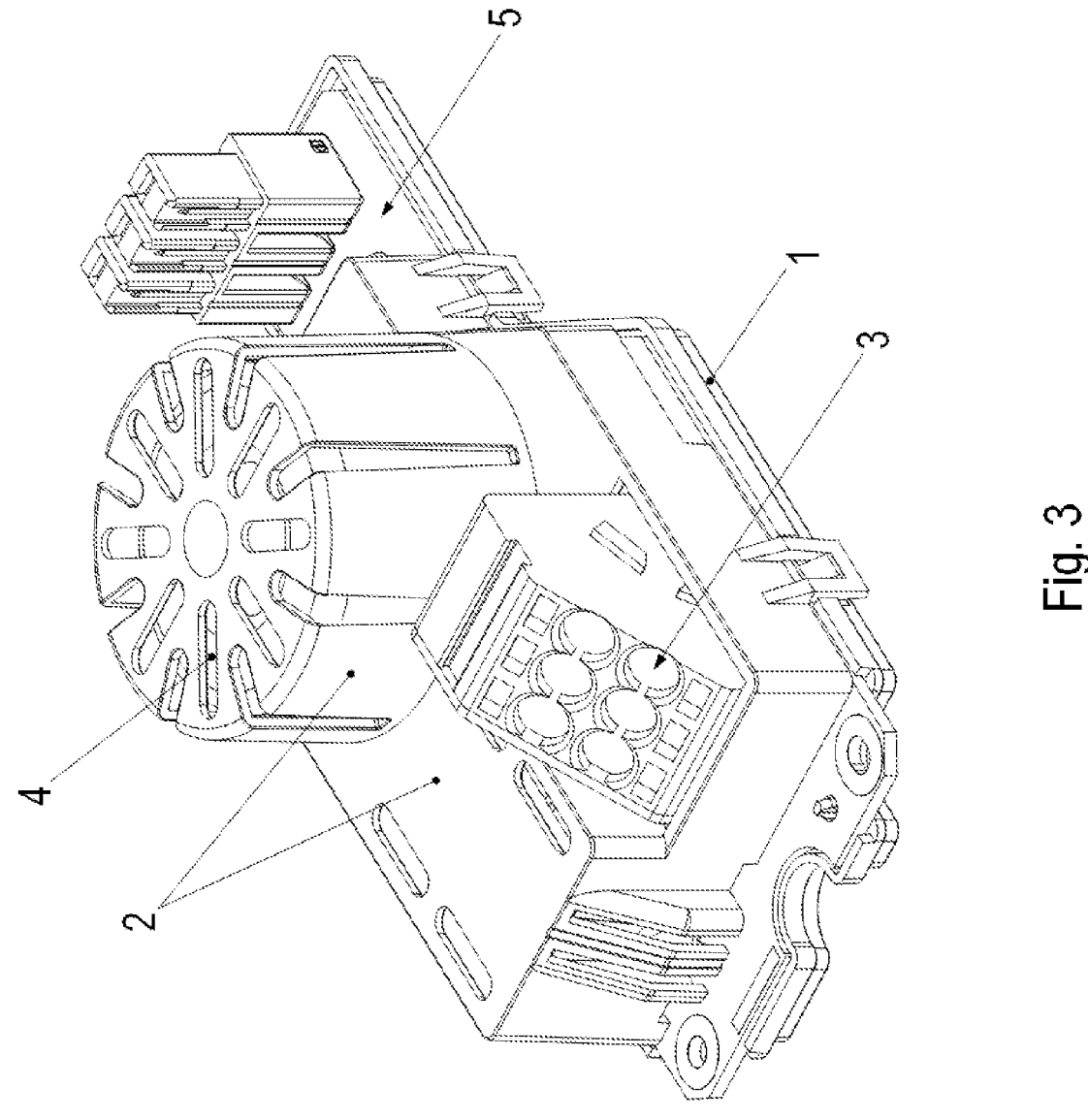
FIG. 3 is a perspective view of the EMC unit.
Figure 4:
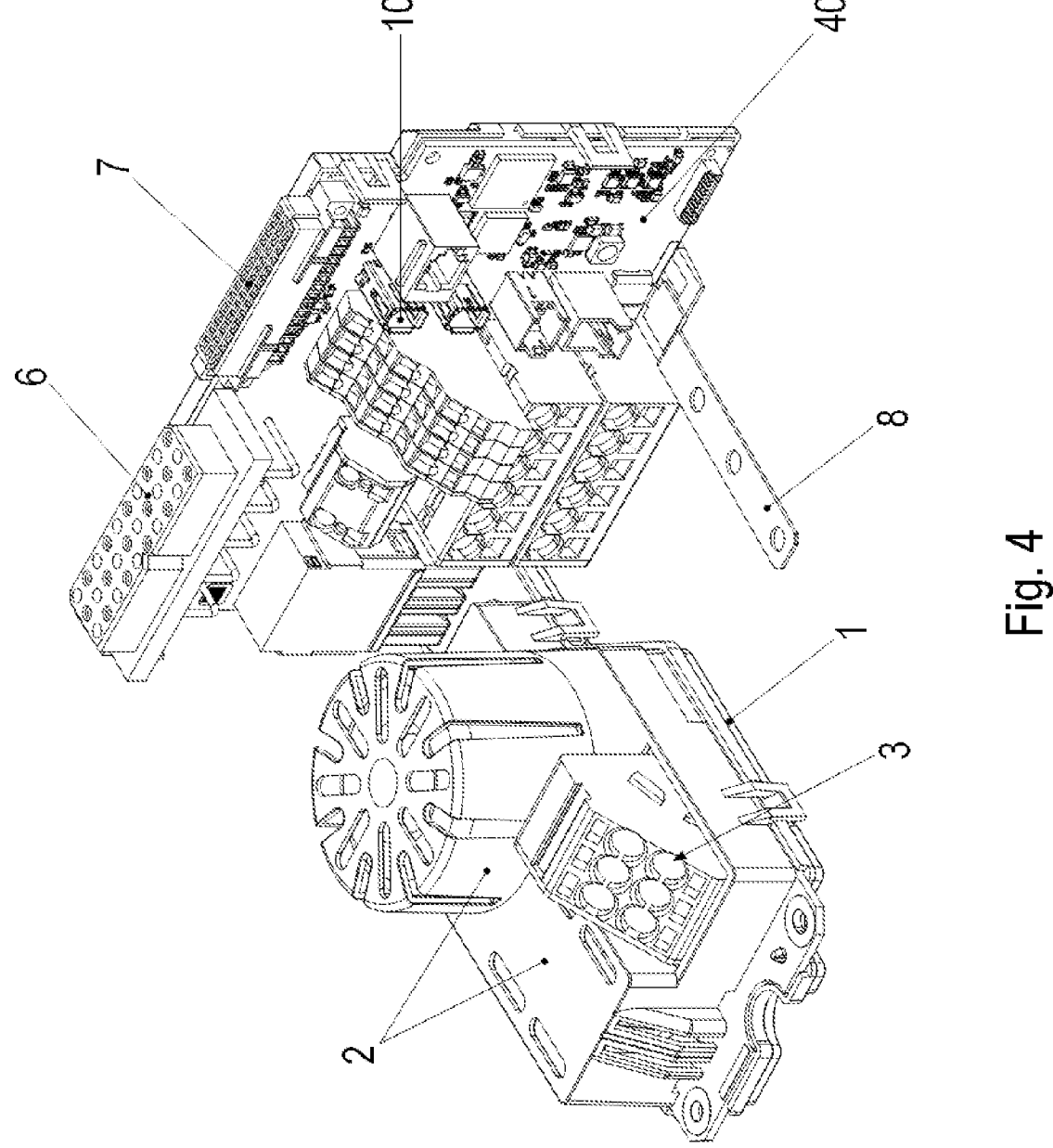
As illustrated in FIG. 4, in contrast to FIG. 1, a region of a cover is removed to expose a printed circuit board 40 of the connection arrangement.

As illustrated in the Figures, the connection arrangement has an EMC unit that is electrically connected to a connection unit by an electrical plug connector 5. Thus, the EMC unit can be exchanged for an EMC unit of a different size if the plug connector 5 is unchanged.

The connection arrangement is arranged in a device. The device is, for example, an electrical device, such as a converter, inverter, controller, or electric motor. The connection arrangement is, for example, arranged in the connection box of the electric motor, and a converter can be arranged in an integrated manner in a cover of the connection box or in the electric motor. In this case, or when the connection arrangement is arranged in the converter, the power electronics of the converter are supplied electrically by a plug connector 6 provided for low voltages, and the signal electronics of the converter are contacted by a third plug connector 7 provided for extra-low voltages.

The connection unit has a printed circuit board 40, which is fitted with a mating plug connector corresponding to the first plug connector 5 and with the second plug connector 6, e.g., for low-voltage lines, as well as with the third plug connector 7, e.g., for extra-low voltage lines, and a grounding plate 8. In addition, a connection 9 for extra-low voltage lines and a connection 10 for data lines are fitted on the printed circuit board 40.

A plastic cover for electrical insulation encloses the printed circuit board 40 in a housing-forming manner. For example, the cover produces the insulation resistance.

For example, the cover is made of two parts, and the two parts of the cover are clip-connected to one another. When clipping in the two parts, the connecting direction is parallel to the actuating direction of the first plug connector 5.

The grounding plate 8 is connected to a housing part of the device using screws. As at least two screws are thus used to connect the grounding plate 8 to the housing part of the device, increased safety can be achieved.

The EMC unit has a lower part 1, which is clip-connected to an upper part 2 to form a housing for the EMC unit. The components for EMC measures, e.g., components for improving electromagnetic compatibility, are arranged inside this housing.

For example, these components include a mains choke 4, which is configured to be suitable for a three-phase current. For example, each phase is assigned a winding, and all windings are arranged on a common ferrite core.

In addition, capacitors 20, e.g., interference suppression capacitors, i.e., Y capacitors, for example, are included as components for EMC measures and arranged within the housing.

In this manner, the interference suppression measures and/or EMC measures are arranged directly next to the connection unit by the EMC unit, since only one first plug connector 5 needs to be arranged therebetween. This provide that interference suppression is close to the point of use and thus that the measures are highly effective.

The upper part 2 is made of plastic and is thus electrically insulating. The low-voltage lines of the mains choke 4 are thus arranged in sufficiently effectively insulated manner and with insulation resistance.

The upper part 2 has through-passing first slots for convective heat dissipation. The upper part 2 follows the contour of the cylindrical mains filter 4 and has radially extending through-passing first slots which, in relation to the cylinder axis, extend radially in the circumferential direction within a flat end face and are evenly spaced from one another in the circumferential direction.

The direction of the normal of the end face is parallel to the cylinder axis. The end face is, for example, bounded in a circular manner.

Further through-passing slots are arranged in the upper part 2 and are evenly spaced from each other in the circumferential direction. These further slots extend along the jacket of the cylinder and, coming from the radially outer edge of the end face, protrude into the end face, in which they extend radially and are spaced apart from the first slots.

The radial distance range covered by the first slots in the radial direction overlaps with the radial distance range covered by the further slots in the radial direction.

In the region around the mains filter, the upper part 2 is hollow-cylindrical, and the first slots and the further slots are arranged in this region.

The cylinder axis is aligned perpendicular to the actuating direction of the first plug connector 5. For example, the actuating direction is a horizontal direction and the cylinder axis is the vertical direction.

The EMC unit is supplied from a mains connection 3, e.g., an AC supply mains connection, and this mains connection 3 has at least three mains phases. For example, three Y capacitors are arranged on the three phases and the windings of the mains choke 4 are connected to the three phases. On the output side, the three phases are routed via the first plug connector 5 to a rectifier of the converter, which provides an intermediate circuit voltage on the DC side to an inverter of the converter. A three-phase motor is connected to the AC side connection of the inverter, which three-phase motor is thus supplied from the converter, e.g., from the inverter of the converter, and can thus be operated with speed control.

The printed circuit board 40 is fitted with an electronic circuit adapted for evaluating the data transmitted via the connection 10 for data lines.

According to example embodiments, the converter is not arranged in the electric motor in an integrated manner, but is arranged remotely, i.e., spaced apart from the electric motor.

According to example embodiments, the electronic circuit has further evaluation units which are adapted for evaluating the signals transmitted via the connection 9 for extra-low voltages.

LIST OF REFERENCE NUMERALS

1 Lower part
2 Upper part

3 Mains connection, e.g., AC supply mains connection
4 Mains choke
5 First plug connector
6 Second plug connector, e.g., for low-voltage lines
7 Third plug connector, e.g., for extra-low voltage lines
8 Grounding plate
9 Connection for extra-low voltage lines
10 Connection for data lines
20 Capacitors, e.g., interference suppression capacitor, Y capacitor

The invention claimed is:

1. A device, comprising:

a connection device including a connection unit and an EMC unit, the EMC unit including a first electrical plug connector connected and/or plug-connected to a mating plug connector of the connection unit and including a connection adapted to connect to supply lines;

wherein the EMC unit includes a housing formed of a lower part and an upper part, a region of the upper part being arranged as a partial region of a hollow cylinder including an end face of the hollow cylinder and a jacket section of the hollow cylinder, the partial region including first slots passing through the upper part, each of the first slots extending radially relative to a cylinder axis of the hollow cylinder and being spaced and/or evenly spaced from one another in a circumferential direction.

2. The device according to claim 1, wherein the supply lines include a mains connection and/or an AC supply mains connection and are adapted to supply the device with electrical power.

3. The device according to claim 1, wherein the EMC unit includes components adapted to improve electromagnetic compatibility and/or to suppress interference.

4. The device according to claim 3, wherein a circuit board is fitted with the components and the first plug connector.

5. The device according to claim 1, wherein the EMC unit includes a mains choke and/or Y capacitors.

6. The device according to claim 5, wherein a circuit board is equipped with the mains choke and/or the Y capacitors and the first plug connector.

7. The device according to claim 1, wherein the EMC unit includes a housing formed from a lower part and an upper part.

8. The device according to claim 7, wherein the housing encloses components, a main choke, and/or Y capacitors of the EMC unit and the first plug connector.

9. The device according to claim 4, wherein the circuit board is enclosed by a housing.

10. The device according to claim 7, wherein the lower part is clip-connected to the upper part.

11. The device according to claim 1, wherein the connection unit includes a printed circuit board enclosed by a cover and fitted with the mating plug connector.

12. The device according to claim 1, wherein the device is arranged as an electric motor with a connection box, the connection arrangement is arranged in the connection box.

13. The device according to claim 12, wherein the connection box includes a cover in which a converter is arranged in an integrated manner.

14. The device according to claim 1, wherein the device is arranged as a converter, the connection arrangement being arranged within a housing of the converter.

15. A device, comprising:

a connection device including a connection unit and an EMC unit, the EMC unit including a first electrical plug connector connected and/or plug-connected to a mating plug connector of the connection unit and including a connection adapted to connect to supply lines;

wherein the EMC unit includes a housing formed from a lower part and an upper part; and wherein a region of the upper part is formed as a partial region of a hollow cylinder, the partial region including an end face of the hollow cylinder and a jacket section of the hollow cylinder.

16. The device according to claim 15, wherein the EMC unit includes a housing formed of a lower part and an upper part, a region of the upper part being arranged as a partial region of a hollow cylinder including an end face of the hollow cylinder and a jacket section of the hollow cylinder, the partial region including first slots passing through the upper part, each of the first slots extending radially relative to a cylinder axis of the hollow cylinder and being spaced and/or evenly spaced from one another in a circumferential direction.

17. The device according to claim 15, wherein the partial region includes first slots passing through the upper part, each of the first slots extending radially relative to a cylinder axis of the hollow cylinder and being spaced and/or evenly spaced from one another in a circumferential direction.

18. The device according to claim 17, wherein each of the first slots covers a same radial distance range in the radial direction and/or the first slots are formed geometrically identical to one another.

19. The device according to claim 17, wherein the partial region includes further slots passing through the upper part, each of the further slots, relative to the cylinder axis of the hollow cylinder, extending both partially over the jacket section and partially in the end face.

20. The device according to claim 19, wherein the further slots are spaced apart from the first slots and/or are spaced apart in the circumferential direction and/or a radial distance range covered by the first slots overlaps with a radial distance range covered by the further slots.

21. The device according to claim 15, wherein the partial region at least partially encloses a mains choke and/or a cylindrical mains choke.

22. The device according to claim 21, wherein a shortest distance between each point of the partial region and the mains choke is less than a maximum distance value and/or a maximum distance value that equals one centimeter.

23. A device, comprising:

a connection device including a connection unit and an EMC unit, the EMC unit including a first electrical plug connector connected and/or plug-connected to a mating plug connector of the connection unit and including a connection adapted to connect to supply lines;

wherein the connection unit includes a printed circuit board enclosed by a cover and fitted with the mating plug connector; and wherein the printed circuit board is fitted with a second plug connector, a third plug connector, a grounding plate, a connection configured for extra-low voltage lines, and/or a connection for data lines.

24. The device according to claim 23, wherein the second plug connector is configured for low-voltage lines and the third plug connector is configured for extra-low-voltage lines.

25. A device, comprising:

a connection device including a connection unit and an EMC unit, the EMC unit including a first electrical plug connector connected and/or plug-connected to a mating plug connector of the connection unit and including a connection adapted to connect to supply lines;

wherein the connection unit includes a printed circuit board enclosed by a cover and fitted with the mating plug connector; and wherein the cover includes at least two parts and/or consists of two parts, the two parts being clip-connected to one another.

26. The device according to claim 25, wherein a connecting direction of the two parts is parallel to an actuating direction of the first plug connector.

27. The device according to claim 25, wherein the cover, an upper part of a housing of the EMC unit, and a lower part of the housing are made of plastic.

28. The device according to claim 27, wherein the plastic is configured to electrically insulate a printed circuit board.

29. The device according to claim 11, wherein the printed circuit board is fitted with a grounding plate.

30. A device, comprising:

a connection device including a connection unit and an EMC unit, the EMC unit including a first electrical plug connector connected and/or plug-connected to a mating plug connector of the connection unit and including a connection adapted to connect to supply lines;

wherein the connection unit includes a printed circuit board enclosed by a cover and fitted with the mating plug connector;

wherein the printed circuit board is fitted with a grounding plate; and wherein the grounding plate is screw-connected to a metal housing part of the device.

* * * * *